United States Patent [19]
Baggini et al.

[11] Patent Number: 5,391,937
[45] Date of Patent: Feb. 21, 1995

[54] LOW POWER DISSIPATION AUTOZEROED COMPARATOR CIRCUIT

[75] Inventors: Barbara Baggini; Giuseppe Palmisano, both of Pavia, Italy

[73] Assignee: Italtel Societa Italiana Telecommunicazioni SPA, Milan, Italy

[21] Appl. No.: 952,876
[22] PCT Filed: May 16, 1991
[86] PCT No.: PCT/EP91/00920
  § 371 Date: Nov. 30, 1992
  § 102(e) Date: Nov. 30, 1992
[87] PCT Pub. No.: WO91/19355
  PCT Pub. Date: Dec. 12, 1991

[30] Foreign Application Priority Data
  May 30, 1990 [IT] Italy .................... 20485 A/90

[51] Int. Cl.[6] ............................ H03K 5/24
[52] U.S. Cl. ............................ 327/78; 327/65
[58] Field of Search ........... 307/354, 355, 358, 364, 307/511, 516, 246, 497, 496; 328/146, 147; 377/58

[56] References Cited
U.S. PATENT DOCUMENTS
| | | | |
|---|---|---|---|
| 3,676,702 | 7/1972 | McGrogan, Jr. | 307/235 |
| 4,028,558 | 6/1977 | Heller et al. | 307/355 |
| 4,211,942 | 7/1980 | Aoki et al. | 307/355 |
| 4,695,748 | 9/1987 | Kumamoto | 307/355 |

FOREIGN PATENT DOCUMENTS
| | | |
|---|---|---|
| 0240830 | 3/1987 | European Pat. Off. |
| 61-075170 | 4/1986 | Japan |
| 61-115029 | 5/1986 | Japan |

*Primary Examiner*—Timothy P. Callahan
*Assistant Examiner*—My-Trang Nu Ton

[57] ABSTRACT

A comparator circuit includes a first amplifier stage whose input can be selectively connected to an input voltage and to a reference voltage. A second amplifier stage is connected to the output of the first amplifier and a final stage is connected to the output of the second amplifier stage, at which a rectangular signal is output. The rectangular signal represents times in which the input signal is higher or lower than the reference signal. Both amplifier stages include a first input capacitance having one plate connected to the input of that stage. The other plate of the capacitance is connected to the gate of a transistor and a control switch. Low power dissipation is realized in the circuit by including a follower cascaded with an inverter. This structure allows the same operation as the prior art but offers a better design flexibility since all design parameters are free to be rearranged to achieve the required performance. Furthermore, the switch of the second stage is opened with a delay compared to the opening of the switch of the first stage. This results in lessening the voltage peaks in input capacitor C1 due to the clock feed through charge injection.

36 Claims, 2 Drawing Sheets

LOW POWER DISSIPATION AUTOZEROED COMPARATOR CIRCUIT

DESCRIPTION

The present invention relates to a low power dissipation autozeroed comparator circuit suitable for CMOS integration.

As known, a comparator circuit receives at its input a constant reference signal and a signal generally variable in time, and produces a square-wave signal representing the times during which the level of the variable signal is higher (or lower) than the threshold represented by the reference signal.

The operation of an autozeroed comparator occurs in two times or phases, an autozero phase $\Phi 1$ where the circuit initial conditions are reset, and phase $\Phi 2$ where the input signal Vin is compared to the reference signal Vref.

Comparators are used in a variety of digital processing systems requiring a conversion interface.

CMOS comparators with autozero-phase designed through switched capacitors (SC) technique, are already well known.

FIG. 1 shows a known circuit of this type, consisting of two cascaded autozeroed inverters, followed by a so-called latch L. A comparator of this type is also disclosed in U.S. Pat. No. 3,676,702.

The basic structure, shown inside the dotted section of FIG. 1, includes two transistors MA1 and MA2, n channel and p channel respectively, connected in series between two voltages $V_{DD}$ and $V_{SS}$, whose gates are shorted. To the gates common node one of plates of comparator input capacitor C1, is connected. Two switches S1 and S2 are foreseen to connect alternatively and subsequently the other plate of capacitance C1 to an input voltage Vin and to a reference voltage Vref, respectively.

The gates common node is connected to capacitance C2 of the subsequent stage through a switch S3, this stage being alike to the previous one and formed by components C2, MA3, MA4 and S4.

In autozero operation (during which the switch S3 is closed) the two transistors MA1 and MA2 are biased in the saturation range with high voltage between gate and source $V_{GS}$ equal to approx $(V_{DD}-V_{SS})/2$.

This condition causes a high bias current Ip to flow through the transistors MA1 and MA2 and, consequently a considerable power dissipation.

One of the objects of the present invention is therefore to eliminate or at least to limit this disadvantage of the present known autozeroed comparators, and in particular to realize a low power dissipation circuit, suitable for integration in CMOS technology.

Another object of the invention is to propose a comparator having improved performances, in particular able to obtain an advantageous compromise between operation speed and power dissipation, together with improved sensitivity performances.

These objects are achieved with the comparator of this invention consisting of an autozeroed comparator circuit, including a first amplifier stage whose input can be selectively connected to an input voltage and to a reference voltage; a second amplifier stage connected to the output of the first amplifier stage; and a final stage, connected to the output of said second amplifier stage at which output a rectangular signal is present, representing the times during which the input signal is higher than the reference signal, characterized by the fact that the two amplifier stages are identical, and include a first inverter and a second inverter respectively, driven by a first follower circuit and a second follower circuit respectively;

wherein said first amplifier stage includes a first input capacitance having one plate that is selectively and not simultaneously connectable, via two controlled input switches, to said reference voltage and to said input voltage, respectively, and the other plate thereof connected to the gate of a first transistor of the first follower circuit, a first controlled switch being provided and said second amplifier stage includes a second input capacitance having one plate connected to the output of said first stage, and the other plate thereof connected to a second transistor of the second follower circuit, a second controlled switch being provided between said other plate and the output of said second stage.

According to the above it can be noted that the inverter in U.S. Pat. No. 3,676,702 is formed by a pair of MOSes, with opposite conductive channels, in a common gate and common drain terminal connection. The bias gate-source MOS voltage are nominally fixed at ½ of the power supply. In pending patent, the inverter consists of four MOSes, functionally grouped by two, realizing the cascade of a follower and an inverting gain stage. This structure allows the performing of the same operation as the traditional inverter, but it offers better design flexibility. Indeed, all design parameters are free and can be arranged to achieve the required performance. In particular, a low power design can be obtained without a sensible speed degradation.

Further embodiments have favorable characteristics as described below.

The invention shall be now described referring to the preferred, but not limiting, realization forms, illustrated in the enclosed figures, where:

Figure 1:
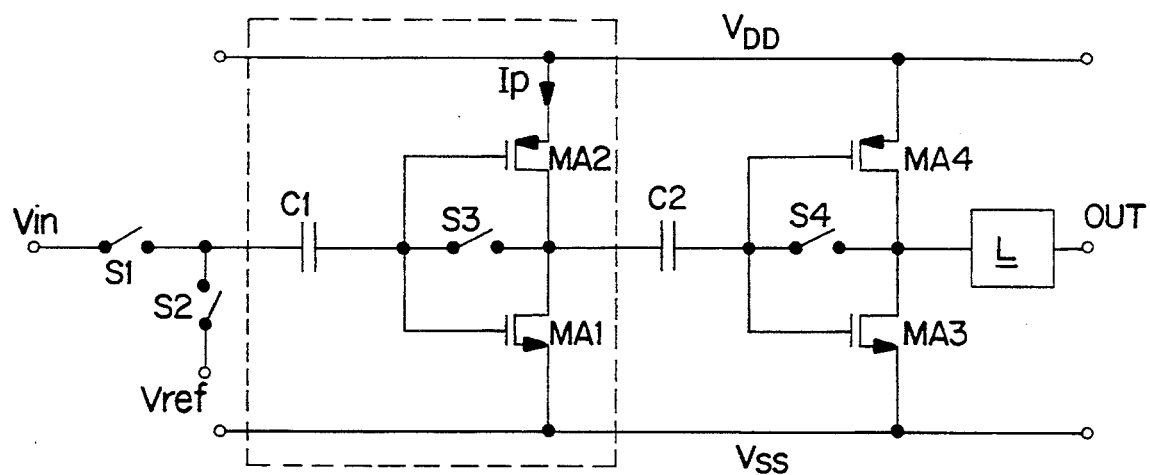
FIG. 1 shows an example of comparator according to the known technique.

FIG. 1 refers to a comparator according to the known technique which has already been examined briefly and shall not therefore be furtherly described.

Figure 2:
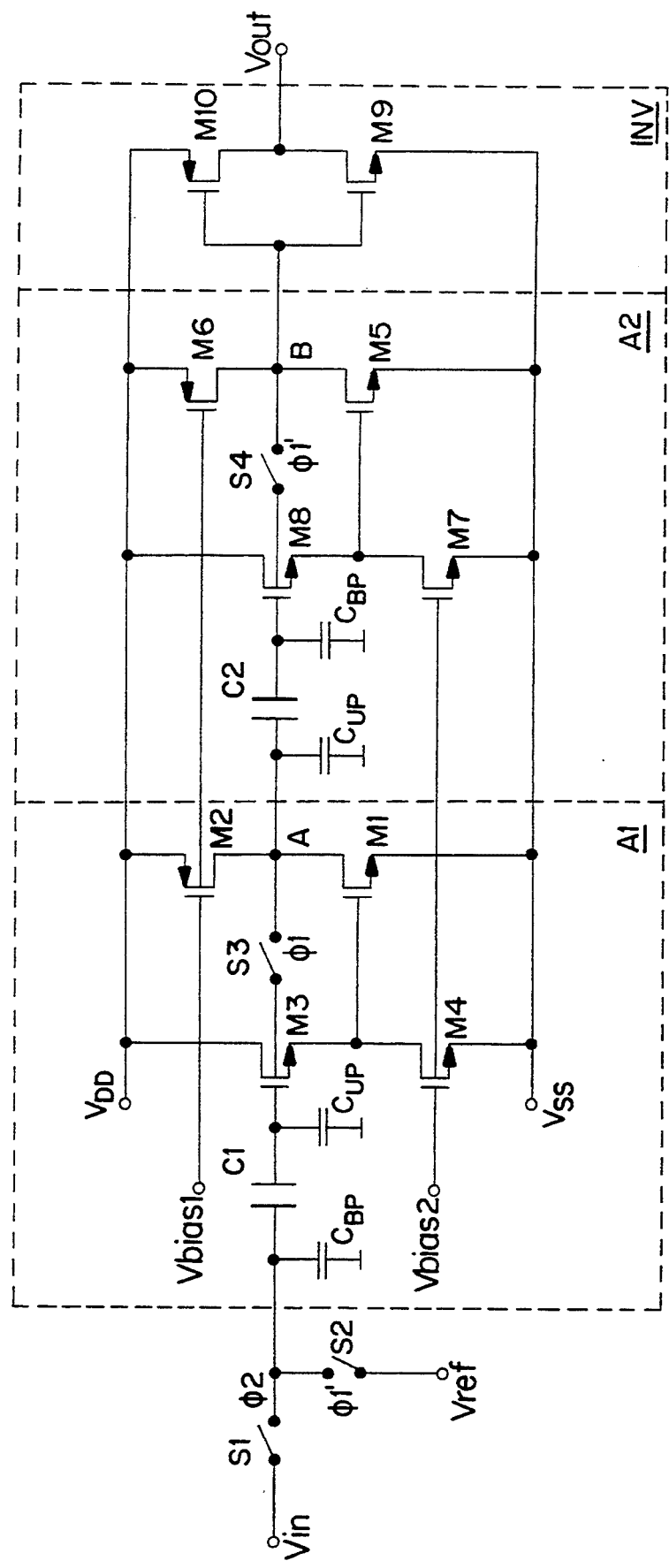
FIG. 2 shows a schematic of the comparator according to the invention.

FIG. 2 shows a schematic of the comparator according to the invention, consisting of a three stage cascade A1, A2 and INV. Stages A1 and A2 are essentially alike and realize the gain required for the operation, while the INV stage is an inverter stage employed to square the outgoing waveform Vout. According to a not shown realization variant, INV stage could be replaced by a latch whose function is to store the voltage at node B on the edge of an appropriate control phase.

Each of the two stages A1 and A2 includes four transistors, M1-M4 and M5-M8, respectively. Since the two stages are essentially identical, stage A1 only shall be described in detail.

This stage includes an inverter circuit (transistors M1 and M2) driven by a follower circuit formed by transistors M3 and M4, shown in FIG. 2 as n channels. An autozeroed CMOS switch S3 is connected between these two circuits; its control clock or phase signal is described below.

Switch S3 is closed when phase Φ1 is active (high) and conventionally, in the Figures, each controlled switch is marked also by a phase signal, meaning by that the switch results being closed when this phase signal is high.

Stage A1 needs two supply voltages $V_{DD}$ and $V_{SS}$, and also two bias voltages, Vbias1 and Vbias 2 for the gates of M2 and M4 transistors, respectively. M3 gate is connected to a plate of the comparator input capacitance C1, whose other plate is connected, selectively and subsequently, to the input voltage Vin and to the reference voltage Vref. In FIG. 2 stray capacitances of C1 plates labelled $C_{BP}$ and $C_{UP}$ are also highlighted, and the same for capacitance C2 of stage A2.

Figure 3:
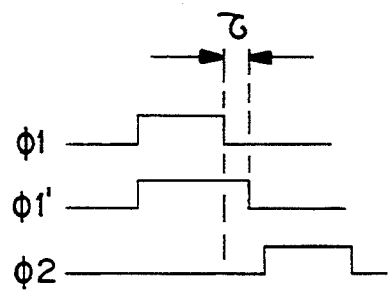
FIG. 3 shows the timing of phase or clock signals.

Connections between C1 and voltages Vin and Vref are assured via the controlled switches S1 and S2, respectively. Specifically, the switch S1 is closed when phase Φ2 is high, while the switch S2 is controlled by a Φ1' signal. As can be seen in FIG. 3, Φ1' is a replica of phase Φ1 where the opening edge has a delay equal to τ compared to the same edge for phase Φ1. However, this delay is such to uphold the transition in the disoverlap range between Φ1 and Φ2.

The output of stage A1 is taken from the common node A of M1 and M2 drain terminals. As already pointed out, the connection between M3 gate and output node A is provided via switch S3 controlled by phase Φ1.

Stage A2 is cascaded to the previous one and is alike. A2 stage output is taken from node B common to M5 and M6 drain terminals. The connection between M8 gate and output node B takes place via switch S4 controlled by phase Φ1'.

The inverter stage INV consists of two transistors M9 and M10 and this stage needs to generate an output waveform with very steep transition edges between high logic level and low logic level.

The comparator circuit operates as follows. During phase Φ1 the comparator autozero is carried out (S3 and S4 switched on) as well as the charging of the input capacitance C1 to the reference level (S2 switched on). Since phases Φ1 and Φ1' are simultaneous, the autorezero operation is carried out on both gain stages A1 and A2.

The autozero is introduced to have all the transistors of the two stages A1 and A2 led again to the linear operation range, between a switching phase and the subsequent one. At the end of this operation, the circuit resides in the initial bias conditions, imposing a voltage value equal to approximately $(V_{DD}-V_{SS})/2$ at nodes A and B. By this operation the values of input and output voltages of each gain stage result equal between them and equal to the half of swing range voltage.

This equal distance of output voltages (intermediate ones in each single stage) from both final logic levels allows to balance the response times (and therefore the speed) of the comparator for input signals higher and lower, of the same magnitude as the reference voltage.

The autozero phase is requested also to compensate the comparator offset, approximately equal to the offset of the first stage A1 since the offset charge stored on capacitor C2 of stage A2, referred to the input of the comparator, is divided by the gain of the first stage and therefore highly attenuated.

In the comparator, measures are taken to minimize voltage peaks in input capacitor C1, due to the clock feed through charge injection at the end of phase Φ1.

This charge injection has to be reduced as much as possible since it is amplified by the gain of both stages A1 and A2 and can originate a false switching of the output towards one of the two possible logic states, depending on the charge sign. The contribution of this charge tends to originate an asymmetrical behaviour of the comparator, accelerating one transition and delaying the other one.

To reduce this charge, CMOS switches S3 and S4 are adequately sized and S4 is also controlled by phase Φ1' whose opening edge is slightly delayed with respect to the one of signal Φ1 controlling S3.

Thus, when S3 is open, S4 remains still closed for the time τ, and the charge injected towards C2 sees low impedance towards the output, entering C2 and traducing an offset voltage equal to (Q/C2) for the stage A2, where (Q) is the clock feed through charge. The charge injected towards C1 sees a low impedance path towards Vref and enters C1.

When after the delay τ S4 opens too, the charge injected towards A charges the parasitic capacitance of C2 ($C_{BP}$). Due to the fact that the voltage drop produced is inversely proportional to such parasitic capacitance, it is preferred to connect the bottom plate of C2 to the gate of M8 as shown in FIG. 2. In this way there is also the advantage to avoid a too high capacitive load at node A which would originate a slowing down of stage A1.

Similarly, the charge deriving from the delayed opening of S2 charges the parasitic capacitance ($C_{BP}$) at the input of stage A1 to which the bottom plate of C1 is connected in order to avoid a partition of the input signal between C1 and the stray capacitance at M3 gate.

During phase Φ2, switch S1 connecting C1 to the input voltage Vin, is closed and the comparison between this voltage and the reference precharged in C1 takes place.

In stages A1 and A2 according to the invention, the follower transistor (M3, M8 respectively) allows biasing the corresponding gain transistors (M1, M5 respectively) in the saturation area, characterized by a low drop voltage between gate and source, with an ensuring reduction of the bias current Ip. Making reference to stage A1, the gain of each stage can be expressed as follows:

$$G = \frac{gm1}{gds1 + gds2}$$

where gm1 is the transconductance of the gain transistor, equal to:

$$\sqrt{2\mu C_{ox}(W/L)I_p} ,$$

and gds1 and gds2 are the channel conductances of the gain transistor and of the load transistor, respectively.

Thus G is proportional to $1/\sqrt{I_p}$, consequently, the possibility to perform a low bias current operation helps the realization of a high gain and therefore of a good sensitivity.

With a fixed bias current meeting the low dissipation specification, the switching speed can be assured through an adequate sizing of transistors M1 and M5. In fact speed is proportional to gm1, which in its turn depends on $\sqrt{Ip(W/L)}$, where W is the width and L is the length of the gain transistor. The gain required for the correct toggling of the comparator is assured by the cascade of the two gain stages.

The final inverter stage INV is constantly unbalanced and not affecting therefore the total power dissipation.

Figure 4:
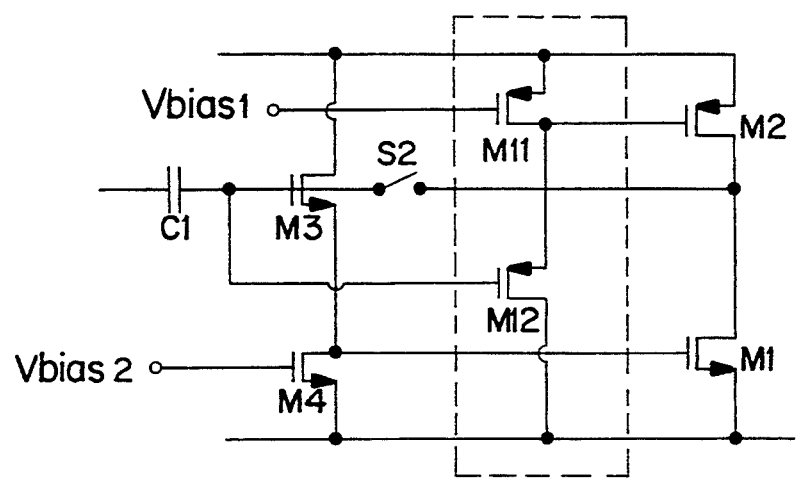
FIG. 4 shows a realization variant of the single gain stage of comparator according to the invention.

According to a further realization form partially shown in FIG. 4, the comparator circuit can include a further follower stage including transistors M11 and M12 driving transistor M2. A similar follower stage is introduced to drive transistor M6, thus obtaining an increase of the gain of each stage and of the switching speed.

Moreover it must be noticed that the optimization between operation speed and circuit power dissipation according to the invention enables also an improvement of sensitivity performance, thanks to the gain enhancement deriving from a lower stationary current.

We claim:

1. A comparator circuit comprising:
   a first amplifier stage having an input of an input voltage or a reference voltage;
   a second amplifier stage connected to an output of the first amplifier stage; and
   a final stage, connected to an output of said second amplifier stage having an output of a rectangular signal, representing times during which an input signal is higher than a reference signal;
   wherein said first and second amplifier stages are identical, and each include an inverter driven by a follower circuit;
   wherein said first amplifier stage includes a first input capacitance having a first plate that is selectively connectable, via at least a first controlled input switch, to said reference voltage and to said input voltage, respectively, and having a second plate connected to a gate of a first transistor of the follower circuit of the first amplifier stage, a second controlled switch being provided between said second plate and the output of said first amplifier stage;
   and said second amplifier stage includes a second input capacitance having a third plate connected to the output of said first amplifier stage, and having a fourth plate connected to a second transistor of the follower circuit of the second amplifier stage, a third controlled switch being provided between said fourth plate and the output of said second amplifier stage.

2. Comparator circuit according to claim 1, wherein said second controlled switch of the first amplifier stage is closed in response to a first phase signal.

3. Comparator circuit according to claim 2, wherein said at least a first controlled input switch connects the input voltage to said first plate in response to a second phase signal, subsequent in time to said first phase signal.

4. Comparator circuit according to claim 2 or 3, wherein said at least a first controlled input switch connects the reference voltage to said first plate and said third controlled switch of the second amplifier stage is closed in response to a third phase signal, active for a longer time period with respect to said first phase signal, but not active when said second phase signal is active.

5. Comparator circuit according to claim 1, wherein said follower circuits of said first and second amplifier stages include n channel CMOS transistors.

6. Comparator circuit according to claim 1, wherein said follower circuits of said first and second amplifier stages include p channel CMOS transistors.

7. Comparator circuit according to claim 1, wherein said first and second amplifier stages each includes an additional follower circuit connected in parallel to said follower circuit of the respective amplifier stage.

8. A comparator comprising:
   at least one stage, each stage of said at least one stage including
   a capacitor having first and second plates;
   an input, directly connected to said first plate;
   a first node as an output of the stage;
   a switch, having an input directly connected to said second plate and an output directly connected to said first node;
   a first transistor, having an input directly connected to said second plate and having an output; and
   a second transistor, having an input directly connected to the output of said first transistor, and having an output connected directly to said first node.

9. The comparator of claim 8, wherein each stage of said at least one stage further includes:
   a first current source connected to the output of said first transistor; and
   a second current source connected to said first node.

10. The comparator of claim 9, wherein in each stage of said at least one stage
    said first current source inputs current from the output of said first transistor; and
    said second current source outputs current to said first node.

11. The comparator of claim 9, wherein in each stage of said at least one stage
    said first and second current sources are transistors biased with bias voltages.

12. The comparator of claim 8 wherein in each stage of said at least one stage
    the input of said first transistor is a gate, the output of the first transistor is a source, the input of the second transistor is a gate and the output of the second transistor is a drain.

13. The comparator of claim 8, wherein said at least one stage includes a preceding stage and a following stage.

14. The comparator of claim 13, further comprising:
    at least, selectively connecting a first and second voltage to said first plate of said capacitor of said preceding stage.

15. The comparator of claim 14, wherein said at least one switch includes two switches.

16. A comparator comprising:
    at least a first switch including an output, selectively outputting both a first and second voltage;
    a capacitor including first and second plates, said first plate directly connected to said output of said at least a first switch;
    first and second transistors connected at a first node, said first transistor directly connected in a source follower configuration and including a gate directly connected to said second plate of said capacitor;
    a third transistor, including a gate directly connected to said first node;

a fourth transistor, directly connected to said third transistor at a second node; and a second switch, selectively connecting said gate of said first transistor and said second node.

17. The comparator of claim 16, further comprising
a low potential source; and
a high potential source; and wherein
said second transistor is connected to said low potential source; and
said fourth transistor is connected to said high potential source.

18. The comparator of claim 17, further comprising:
a low bias potential; and
a high bias potential; and wherein
said second transistor includes a gate connected to said low bias potential; and
said fourth transistor includes a gate connected to said high bias potential,
so that said second and fourth transistors act as a current source.

19. The comparator of claim 18, wherein
said second transistor includes a source connected to said low potential source; and
said fourth transistor includes a source connected to said high potential source.

20. The comparator of claim 19, wherein
said first transistor includes a drain connected to said high potential source and a source connected to said first node;
said second transistor includes a drain connected to said first node;
said third transistor includes a source connected to said low potential source and a drain connected to said second node; and
said fourth transistor includes a drain connected to said second node.

21. The comparator of claim 16, wherein
said first transistor includes a source connected to said first node;
said second transistor includes a drain connected to said first node;
said third transistor includes a drain connected to said second node; and
said fourth transistor includes a drain connected to said second node.

22. A comparator comprising:
at least one selective switch, outputting a first potential for a first time period and a second potential for a second time period;
a first capacitor, including first and second plates, said first plate connected to an output of said at least one selective switch;
a second capacitor, including third and fourth plates;
a first connecting switch, connecting said second plate of said first capacitor with said third plate of said second capacitor for a third time, period, the third time period shorter than said first time period.

23. The comparator of claim 22 further comprising:
a second connecting switch, connecting said fourth plate of said second capacitor with an output node for said first period of time.

24. The comparator of claim 22 wherein said first and second periods of time are consecutive, and said first and third periods of time start at the same time.

25. The comparator of claim 22, further comprising:
a first transistor, including a control input receiving a potential related to a potential of said second plate of said first capacitor and including an output outputting a potential to said third plate of said second capacitor.

26. The comparator of claim 25, further comprising:
a feedback loop from said output of said first transistor to said control input of said first transistor.

27. The comparator of claim 26, wherein said feedback loop includes said first connecting switch.

28. The comparator of claim 27, wherein said feedback loop includes:
a second transistor, including a control input of said first connecting switch and including an output connected to said control input of said first transistor.

29. The comparator of claim 28, wherein said control input of said second transistor is also connected to said second plate of said first capacitor.

30. The comparator of claim 29, wherein said second connecting switch is connects said fourth plate of said second capacitor and an output node and further comprising:
a third transistor, including a control input receiving a potential related to a potential of said fourth plate of said second capacitor and including an output connected to said output node; and
a fourth transistor, including a control input connected to said fourth plate of said second transistor and including an output connected to said control input of said third transistor, thus in conjunction with said second connecting switch, forming a second feedback loop from said output of said third transistor to said control input of said third transistor.

31. The comparator of claim 30, wherein
said control inputs of said first, second, third and fourth transistors are gates of said first, second, third and fourth transistors, respectively;
said outputs of said first and third transistors are drains of said first and third transistors, respectively; and
said outputs of said second and fourth transistors are drains of said second and fourth transistors, respectively.

32. The comparator of claim 29, further including:
a first current source connected to said third plate of said second capacitor; and
a second current source, connected to said output of said second transistor.

33. The comparator of claim 32, wherein said first and second current sources include transistors biased with bias potentials.

34. A method of operating a comparator, the comparator including at least a first and second stage, both the first and second stage having a capacitor, a transistor having an input of the capacitor and an output to an output node, and a connecting switch, connecting the capacitor with the output node, the output node of the first stage connected to the capacitor of the second stage, the method comprising:
(a) closing the connecting switch of the first stage, to thereby connect the capacitor of the first stage with the output node of the first stage;
(b) closing the connecting switch of the second stage, simultaneously with the closing of step (a), thereby connecting the capacitor of the second stage with the output node of the second stage;
(c) opening the connecting switch of the first stage; and (d) opening the connecting switch of the second stage after a first time period elapses from the opening in step (c).

35. The method of claim 34, further comprising:
(e) applying a first potential to the capacitor of the first stage when the connecting switch of the first stage is closed; and
(f) applying a second potential to the capacitor of the first stage simultaneously with the opening of the connecting switch of the first stage is opened in step (c).

36. The method of claim 35, further comprising:
(g) repeating steps (a) through (f).

* * * * *